(12) United States Patent
Nakano et al.

(10) Patent No.: US 11,979,066 B2
(45) Date of Patent: May 7, 2024

(54) ELECTRIC POWERED DRIVE DEVICE, AND METHOD FOR ASSEMBLING ELECTRIC POWERED DRIVE DEVICE

(71) Applicant: HITACHI ASTEMO, LTD., Hitachinaka (JP)

(72) Inventors: Kazuhiko Nakano, Hitachinaka (JP); Takuro Kanazawa, Hitachinaka (JP); Narutoshi Yamada, Hitachinaka (JP); Tomohiro Fukuda, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 302 days.

(21) Appl. No.: 17/631,100

(22) PCT Filed: Aug. 18, 2020

(86) PCT No.: PCT/JP2020/031083
§ 371 (c)(1),
(2) Date: Jan. 28, 2022

(87) PCT Pub. No.: WO2021/033678
PCT Pub. Date: Feb. 25, 2021

(65) Prior Publication Data
US 2022/0278594 A1    Sep. 1, 2022

(30) Foreign Application Priority Data
Aug. 21, 2019   (JP) .................................. 2019-151009

(51) Int. Cl.
*H02K 11/33*    (2016.01)
*H01R 12/71*    (2011.01)
(Continued)

(52) U.S. Cl.
CPC ............. *H02K 11/33* (2016.01); *H01R 12/71* (2013.01); *H02K 5/225* (2013.01); *H05K 3/36* (2013.01); *H02K 2211/03* (2013.01)

(58) Field of Classification Search
CPC .... H02K 11/33; H02K 5/225; H02K 2211/03; H01R 12/71; H01R 12/73; H01R 12/716; H05K 3/36; H05K 1/144; H05K 2201/042
See application file for complete search history.

(56) References Cited

U.S. PATENT DOCUMENTS

2020/0321839 A1    10/2020    Tateyama et al.

FOREIGN PATENT DOCUMENTS

| CN | 102480215 A | * | 5/2012 | ............ H01R 12/71 |
| JP | H05-218669 A | | 8/1993 | |

(Continued)

OTHER PUBLICATIONS

International Search Report dated Oct. 13, 2020 issued in International Application No. PCT/JP2020/031083, with English translation, 6 pages.

(Continued)

*Primary Examiner* — Mohamad A Musleh
(74) *Attorney, Agent, or Firm* — FOLEY & LARDNER LLP

(57) ABSTRACT

A first circuit board 16 and a second circuit board 17, each of which have mounted thereon circuit components for controlling and driving an electric motor, are stacked with a space left therebetween such that one board surface of the first circuit board and one board surface of the second circuit board are opposed to and face each other in the direction of a rotation shaft 14 of the electric motor. In a state that the first circuit board 16 and the second circuit board 17 are attached to the motor housing, a receptacle connector 28

(Continued)

mounted on the first circuit board and a plug connector 34 mounted on the second circuit board form a "board-to-board connector" by which the circuit components of the first and second circuit boards are electrically connected.

14 Claims, 9 Drawing Sheets

(51) Int. Cl.
    *H02K 5/22*         (2006.01)
    *H05K 3/36*         (2006.01)

(56)                References Cited

FOREIGN PATENT DOCUMENTS

| JP | 2007-234860 A | 9/2007 | | |
|---|---|---|---|---|
| WO | WO-2019/131991 A1 | 7/2019 | | |
| WO | WO-2019235077 A1 * | 12/2019 | ........... | B62D 5/0403 |

OTHER PUBLICATIONS

Written Opinion dated Oct. 13, 2020 issued in International Application No. PCT/JP2020/031083, with English translation, 12 pages.

* cited by examiner

ELECTRIC POWERED DRIVE DEVICE, AND METHOD FOR ASSEMBLING ELECTRIC POWERED DRIVE DEVICE

FIELD OF THE INVENTION

The present invention relates to an electric drive device and, more particularly, to an electric drive device having integrated therein an electronic control unit and a method for assembling such an electric drive device.

BACKGROUND ART

In the general industrial machinery field, it is common to drive a mechanical control element by an electric motor. Recently, there has come into use a so-called mechanically and electrically integrated type electric drive device in which an electronic control unit is integrally mounted to an electric motor, with a semiconductor element etc. provided in the electronic control unit to control a rotation speed and torque of the electric motor.

As an example of the mechanically and electrically integrated type electric drive device, an electric power steering device for a vehicle is configured to detect a rotation speed and torque of a steering shaft caused by driver's steering wheel operation, and then, drive an electric motor based on the detection results so that the electric motor is rotated in the same direction as the rotation direction of the steering shaft to generate a steering assist torque. In this electric power steering device, an electronic control unit is provided to control the electric motor.

One such type of electric power steering device is disclosed in International Publication No. 2009/131991 (Patent Document 1). The electric power steering device of Patent Document 1 is composed of an electric motor unit and an electronic control unit. The electric motor unit has a motor housing formed of an aluminum alloy etc. in a cylindrical shape and an electric motor installed in the motor housing. The electronic control unit has a circuit board mounting thereon electrical components and electronic components. The circuit board is attached to an end wall of the motor housing which is located axially opposite to an output shaft of the electric motor, and serves as a heat sink.

The circuit board attached to the end wall of the motor housing includes a power supply circuit section for providing a required power supply, a power conversion circuit section equipped with power switching elements such as MOSFET or IGBT for drive control of the electric motor and a control circuit section for controlling the power switching circuit. Output terminals of the power switching elements and input terminals of the electric motor are electrically connected to each other via a busbar.

Incidentally, a power conversion circuit board equipped with a power conversion circuit section, a power supply circuit board equipped with a power supply circuit section and a control circuit board equipped with a control circuit section are stacked in the direction of a rotation shaft of the electric motor. It is thus necessary to connect these circuit boards by connection terminals in order to establish electrical connection between the circuit boards. Lead frame terminals, or a flexible terminal having flexibility as disclosed in Patent Document 1, are conventionally used for electrical connection.

As other examples of the electric drive device in which the electronic control unit is integrated, there are known an electric brake and a hydraulic control device for various hydraulic controls.

In the following description, an explanation will be given of an electric power steering device as a representative example of the electronic drive device.

PRIOR ART DOCUMENTS

Patent Document

Patent Document 1: International Publication No. 2009/131991

SUMMARY OF THE INVENTION

Problem to be Solved by the Invention

In the case of connecting circuit boards with the use of lead frame terminals, there arises problems that: the board occupying area becomes large due to large terminal pitches; the number of assembling process steps increases with the need to perform soldering operation on each terminal; and the terminal has a fear of breakage by resonance because of its elongated terminal shape. For these reasons, the use of the lead frame terminals is not suitable for the electric drive device where miniaturization and cost reduction are required.

In the case of connecting circuit boards with the use of a flexible terminal as disclosed in Patent Document 1, two circuit terminals and the flexible terminal need to be connected in advance. There thus arises an additional problem that the production cost increases with increase in the number of assembling process steps.

It is accordingly an object of the present invention to provide a novel electric drive device in which electrical connection is made between circuit boards during assembling process and a method for assembling such an electric drive device.

Means for Solving the Problems

The present invention is directed to an electric drive device comprising, an electric motor, a motor housing and first and second circuit boards,
    wherein the first and second circuit boards mounting thereon circuit components for driving and controlling the electric motor are staked, with a space left therebetween, such that one board surface of the first circuit board and one board surface of the second circuit board are opposed to and face each other in the direction of a rotation shaft of the electric motor, and
    wherein, in a state that the first and second circuit boards are attached to an end wall of the motor housing, a plug connector mounted on the first circuit board and a receptacle connector mounted on the second circuit board form a board-to-board connector between the one board surfaces of the first and second circuit boards so that the circuit components of the first and second circuit boards are electrically connected by the board-to-board connector.

Effects of the Invention

According to the present invention, electrical connection is made between the first and second circuit boards during the assembling process of the electric drive device.

DESCRIPTION OF EMBODIMENTS

Hereinafter, an embodiment of the present invention will be described in detail below with reference to the drawings. It is however to be understood that: the present invention is not limited to the following embodiment. Various modification examples and application examples can be made based on the technical concept of the present invention. Those modification examples and application examples are included in the scope of the present invention.

Figure 1:
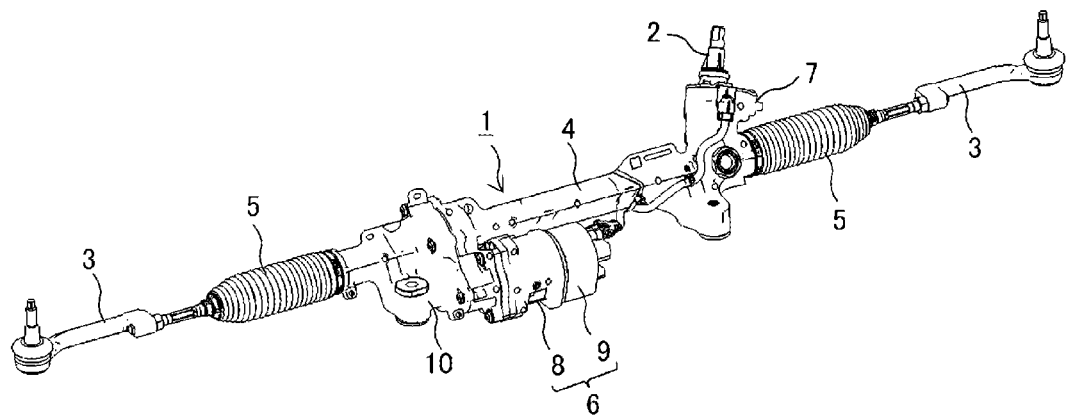
FIG. 1 is an overall perspective view of a steering apparatus.

Before addressing one embodiment of the present invention, the configuration of a steering apparatus as an example of application of the present invention will be briefly described below with reference to FIG. 1.

Here will be explained the steering apparatus for steering front wheels of a vehicle. The steering apparatus 1 is configured as shown in FIG. 1. A pinion (not shown) is disposed on a lower end of a steering shaft 2 which is coupled to a steering wheel (not shown). This pinion is in mesh with a rack (not shown) which is elongated in a left-right direction of the vehicle body.

Tie rods 3 for steering the vehicle front wheels left or right are coupled to both ends of the rack. The rack is covered by a rack housing 4. Rubber boots 5 are disposed between the housing 4 and the tie rods 3.

An electric power steering device 6 is arranged to assist a torque for steering operation of the steering wheel. More specifically, a torque sensor 7 is provided to detect a rotational direction and torque of the steering shaft 2; an electric motor unit 8 is provided to apply a steering assist force to the rack through a reduction gear 10 based on the detection results of the torque sensor 7; and an electronic control unit 9 is provided to control an electric motor of the electric motor unit 8.

In the electric power steering device 6, the electric motor unit 8 is connected at three outer peripheral positions thereof on the output shaft side to the reduction gear 10 by bolts (not shown). The electronic control unit 9 is located on a side of the electric motor unit 8 opposite to the output shaft.

The electric power steering device 6 operates as follows. When the steering shaft 2 is rotated in either direction by operation of the steering wheel, the torque sensor 7 detects the rotational direction and torque of the steering shaft 2. A control circuit section of the electronic control unit 9 determines a drive operation amount of the electric motor based on the detection results of the torque sensor.

Then, the electric motor is driven by power switching elements of a power conversion circuit section of the electronic control unit 9 according to the determined drive operation amount, whereby the output shaft of the electric motor is rotated in the same direction as the rotation direction of the steering shaft 2. The rotation of the output shaft is transmitted from the pinion to the rack through the reduction gear for steering of the vehicle.

In the present embodiment, a first circuit board and a second circuit board, each of which has mounted thereon circuit components for driving and controlling the electric motor, are arranged in a stacked manner, with a space left therebetween, such that one board surface of the first circuit board and one board surface of the second circuit board are opposed to and face each other in the direction of the rotation shaft of the electric motor; and, in a state that the first and second circuit boards are attached to an end wall of the motor housing, a plug connector mounted on the first circuit board and a receptacle connector mounted on the second circuit board form a "board-to-board connector" between the opposed board surfaces of the first and second circuit boards so that the circuit components of the first and second circuit boards are electrically connected by the board-to-board connector.

With this configuration, electrical connection is made between the first and second circuit boards during the assembling process.

The more detailed configuration of the electric power steering device as one embodiment of the present invention will be described below with reference to FIGS. 2 to 14.

Figure 2:
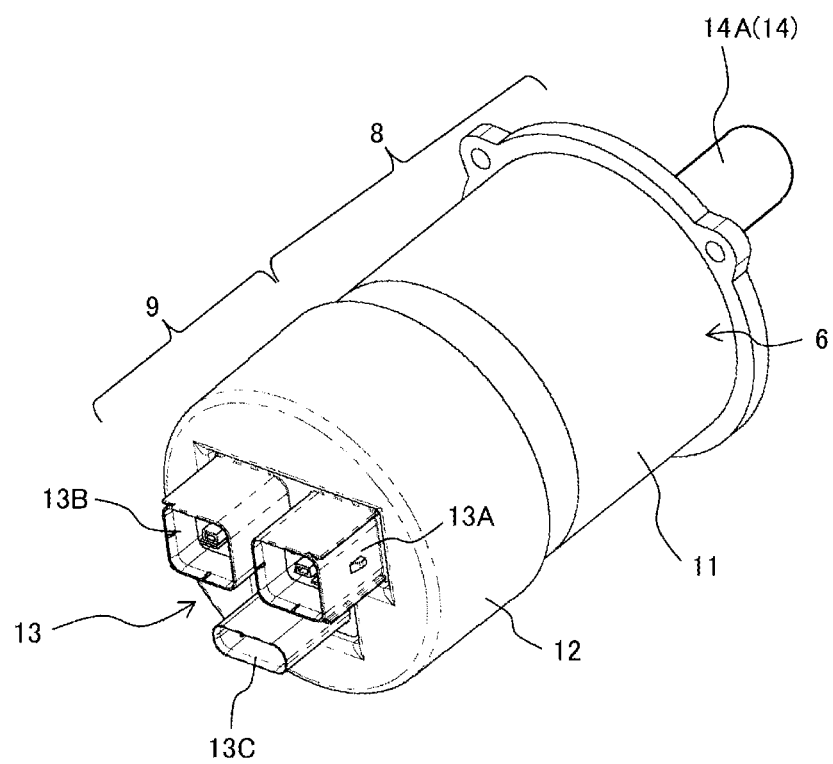
FIG. 2 is an overall perspective view of an electric power steering device in which the present invention is embodied.

As shown in FIG. 2, the electric motor unit 8 of the electric power steering device 6 includes: the motor housing 11 having a cylindrical portion formed of an aluminum alloy; and the electric motor (not shown) installed in the motor housing. The electronic control unit 9 of the electric power steering device includes: a cap cover 12 formed of an aluminum alloy etc. and located opposite to the rotation shaft 14 in the axis direction of the motor housing 11; and an electronic control unit assembly installed in the cap cover.

An end face of the motor housing 11 and an end face of the cap cover 12 are opposed to each other and are integrally fixed together by an adhesive, welding or fixing bolts. The electronic control unit assembly (hereinafter referred to as electronic control unit 9) installed in an installation space inside the cap cover 12 contains: a power supply circuit section that provides a required power supply; a power conversion circuit section that has power switching elements such as MOSFET or IGBT to perform drive control on the electric motor of the electric motor unit 8; and a control circuit section that controls the power switching elements. Output terminals of the power switching elements are electrically connected to coil input terminals of the electric motor via a busbar.

In the present embodiment, the power supply circuit section and the power conversion circuit section are disposed on the same circuit board. In other words, the electronic control unit 9 has two circuit boards: a power supply/conversion circuit board equipped with the power supply circuit section and the power conversion circuit section and a control circuit board equipped with the control circuit section in the present embodiment. Alternatively, the electronic control unit 9 may have three circuit boards: a power supply circuit board equipped with the power supply circuit section, a power conversion circuit board equipped with the power conversion circuit section and a control circuit board equipped with the control circuit section.

Further, the power supply circuit section, the power conversion circuit section and the control circuit section are provided in a redundant configuration such that the circuit sections of exactly the same structure are disposed on each circuit board. In the present embodiment, the electric motor have sets of coils arranged in a redundant configuration so that the systems in the redundant configuration of the electronic control unit 9 correspond to those in the redundant configuration of the motor coil arrangement. For example, in the event of a failure in one control circuit section, one of the coil sets corresponding to this control circuit section does not function. In such a case, however, the other coil set functions under the control of the other control circuit section so that the electric motor performs steering assist by means of the other coil set.

A connector assembly 13 is provided on the end face of the cap cover 12. The connector assembly 13 includes a power supply terminal forming part 13A for one electronic control circuit system, a power supply terminal forming part 13B for the other electronic control circuit system and a signal terminal forming part 13C for sending input information from external sensors and control status information to external equipment.

The electronic control unit 9 installed in the cap cover 12 is supplied with power from a power supply through the power supply terminal forming parts 13A and 13B which are made of a synthetic resin. Operating condition detection signals are inputted from the detection sensors into the electronic control unit through the signal terminal forming part 13C. Further, the current control status information of the electric power steering device is outputted from the electronic control unit through the signal terminal forming part 13C.

Figure 3:
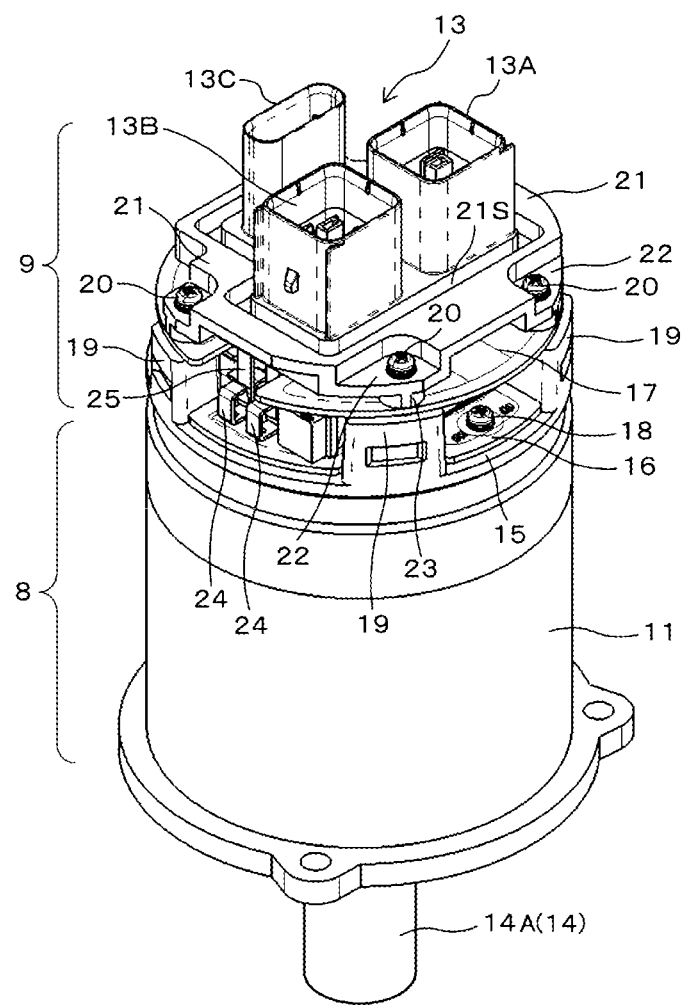
FIG. 3 is a perspective view of an electronic control unit of the electric power steering device according to one embodiment of the present invention, as seen from diagonally above, in a state that a cap cover has been removed from the electronic power steering device.

FIG. 3 is a perspective view of the electric power steering device 6 in a state that the cap cover has been removed. An annular side yoke (not shown) made of iron is fitted in the motor housing 11. The electric motor (not shown) is placed in the side yoke. An output part 14A (see FIG. 2) is provided on an end portion of the rotation shaft of the electric motor such that the steering assist force is applied by this output part to the rack through the gear. Since the concrete structure of the electric motor is well known, a description of the concrete structure of the electric motor will be omitted herefrom.

The motor housing 11 is formed of an aluminum alloy and serves as a heat sink for radiating heat generated by the electric motor and heat generated by the power supply and conversion circuit sections to the outside atmosphere. The electric motor unit 8 is constituted by the electric motor and the motor housing 11.

The end wall 15 of the motor housing 11 is located on the side of the electric motor unit 8 opposite to the output part 14A. The electronic control unit 9 is secured to the end face wall 15. The electronic control unit 9 is generally provided with the power conversion circuit section, the power supply circuit section and the control circuit section. The power conversion circuit section and the power supply circuit section are disposed on the common circuit board (referred to as "power supply/conversion circuit board") 16, whereas the control circuit section is disposed on the control circuit board 17.

The end wall 15 of the motor housing 11 serves as a heat sink. Although the end wall 15 is formed integral with the motor housing 11 in the present embodiment, the end wall 15 may alternatively be formed as a separate member and fixed to the motor housing 11 by bolts or welding.

As the power conversion circuit section, the power supply circuit section and the control circuit section are provided in a redundant configuration, there is formed a dual system structure having two electronic control units as first and second systems. Under normal conditions, these electronic control units operate together as a regular electronic control unit. In the event of an anomaly or failure in one of these electronic control units, the other electronic control unit operates to drive and control the electronic motor with half power.

In this case, the power of the electric motor becomes half. The electric motor unit however secures so-called "power steering function". Accordingly, heat generated from the first system electronic control unit and from the second system electronic control unit is transferred to the motor housing 11 under normal conditions.

Alternatively, there may be formed a dual system structure having main and sub electronic control units. In this case, the electric motor operates to driven and control the electric motor under normal conditions. In the event of an anomaly or failure in the main electronic control unit, the sub electronic control unit is switched into operation to drive and control the electric motor. Accordingly, heat generated from the main electronic control unit is transferred to the motor housing 11 under normal conditions. In the event of an anomaly or failure in the main electronic control unit, heat generated from the sub electronic control unit is transferred to the motor housing 11 as the sub electronic control unit is switched into operation with stop of the main electronic control unit.

The electronic control unit 9 is constituted by: the power supply/conversion circuit board 16 on which the power supply circuit section and the power conversion circuit section are mounted; the control circuit board 17 on which the control circuit section is mounted; and the connector assembly 13. The power supply/conversion circuit board 16, the control circuit board 17 and the connector assembly 13 are arranged in this order from the end wall 15 side along the direction of the axis of the motor housing 11.

Herein, the axis of the motor housing means an axial line which substantially coincides with a center line of the rotation shaft 14 of the electric motor installed in the motor housing 11. The axis of the motor housing may be hereinafter occasionally simply referred to as the axis.

The control circuit section on the control circuit board 17 is configured to generate a control signal to drive power switching elements of the power conversion circuit section, and is provided with a microcomputer and peripheral circuit blocks etc. The power supply circuit section on the power supply/conversion circuit board 16 is configured to provide a power supply to the control circuit section and to the power conversion circuit section, and is provided with a capacitor, a coil etc. The power conversion circuit section on the power supply/conversion circuit board 16 is configured to regulate power flowing through the coils of the electric motor, and is provided with power switching elements constituting three-phase upper and lower arms.

The control circuit board 17 has a glass epoxy substrate mounting thereon circuit components such as electrical components and electronic components as constituent parts (i.e. microcomputer and peripheral circuit blocks) of the control circuit section so that the circuit components are disposed on a board surface of the control circuit board 17. The control circuit board 17 is aligned in a radial direction perpendicular to the rotation shaft of the electric motor. The power supply/conversion circuit board 16 has a glass epoxy substrate mounting thereon circuit components such as electrical components and electronic components as constituent parts (i.e. capacitor, coil, power switching elements constituting upper and lower arms) of the power supply and conversion circuit sections so that the circuit components are disposed on the board surface of the power supply/conversion circuit board 16. The power supply/conversion circuit board 16 is also aligned in the radial direction perpendicular to the rotation shaft of the electric motor The control circuit board 17 and the power supply/conversion circuit board 16 are sequentially stacked with a space left therebetween in the axis direction. In other words, the power supply/conversion circuit board 16 and the control circuit board 17 are arranged in this order from the end wall 15 side such that the board surfaces of the respective circuit boards are opposed to and face each other. The board-to-board connector (not shown) is provided between these opposed board surfaces. The detailed configuration of the board-to-board connector will be described later.

In the electronic control unit 9, the amounts of heat generated by the power conversion circuit section and the power supply circuit section are generally large. The heat generated by the power conversion and supply circuit sections is radiated from the motor housing 11 of aluminum alloy through the power supply/conversion circuit board 16. In the present embodiment, the power supply/conversion circuit board 16 is attached in close contact with the end wall 15 of the motor housing 11 by fixing bolts 18.

An electrically insulating and highly thermally conductive sheet, grease or adhesive etc. may be applied to the end wall 15 of the motor housing 11 and the contact surface of the power supply/conversion circuit board 16. With the application of such an electrically insulating and highly thermally conductive material, the heat radiation performance of the power supply/conversion circuit board 16 is improved.

Board fixing supporting parts 19 are formed at four locations on a radially outer peripheral portion of the end wall 15 of the motor housing 11 so as to extend in a direction away from the end wall 15 along the axis of the rotation shaft of the electric motor. The board fixing supporting parts 19 include a pair of narrowly spaced board fixing supporting parts (narrow spaced parts) 19A and a pair of widely spaced board fixing supporting parts (wide spaced parts) 19B as will be described later.

A height of the board fixing supporting parts 19 is set to provide a predetermined space between the power supply/conversion circuit board 16 and the control circuit board 17. More specifically, the height of the board fixing supporting parts 19 is set greater than or equal to a height required for installation of the circuit components of the power supply and conversion circuit sections. Further, the height of the board fixing supporting parts 19 is set greater than equal to a height required for installation of the "board-to-board connector" in a state that electrical connection is made by the "board-to-board connector".

In other words, the height of the board fixing supporting parts 19 is set such that, when the control circuit board 17 is attached after attachment of the power supply/conversion circuit board 16, the circuit components of the power conversion and supply circuit sections do not interfere with the board surface of the control circuit board 17.

The control circuit board 17 is placed on the board fixing supporting parts 19 and is fixed to the board fixing supporting parts 19 by fixing bolts 20 through the connector assembly 13. The connector assembly 13 includes, in addition to the power supply terminal forming part 13A, the power supply terminal forming part 13B and the signal terminal forming part 13C, a board fixing surface part 21 formed in a substantially plate shape perpendicular to the direction (axis direction) in which the respective terminal forming parts 13A, 13B and 13C extend. The control circuit board 17 is thus held between the board fixing surface part 21 and the board fixing supporting parts 19.

Recess portions 22 are formed in the board fixing surface part 21 so as to accommodate therein the fixing bolts 20. In the present embodiment, four recess portions 22 are formed corresponding to the respective board fixing supporting parts 19. Spacer sections 23 are formed on control circuit board 17 sides of the recess portions 22 of the board fixing surface part 21 so that the circuit components of the control circuit section of the control circuit board 17 are installed in a space defined by the spacer sections 23. Bolt insertion holes through which threaded portions of the fixing bolts 20 are inserted are formed in the spacer sections 23.

The electronic control unit 9 is assembled onto the electric motor unit 8 by the following procedure. First, the power supply/conversion circuit board 16 on which the power supply circuit section and the power conversion circuit section are mounted is placed on the end wall 15 of the motor housing 11. The power supply/conversion circuit board 16 is then fixed to the end wall 15 by the fixing bolts 18.

As will be described later with reference to FIG. 4, the board surface of the power supply/conversion circuit board 16 has an outer shape according to the arrangement positions of the board fixing supporting parts (narrow spaced parts) 19A and the board fixing supporting parts (wide spaced parts) 19B so that the board fixing supporting parts (narrow spaced parts) 19A and the board fixing supporting parts (wide spaced parts) 19B have the function of positioning the power supply/conversion circuit board 16.

Next, the control circuit board 17 on which the circuit components of the control circuit section are mounted is placed on top faces of the board fixing supporting parts 19. The board fixing surface part 21 of the connector assembly 13 is subsequently placed from above the control circuit board 17. When the fixing bolts 20 are inserted through the bolt insertion holes of the recess portions 22 of the board fixing surface 21 and screwed into bolt holes of the board fixing supporting parts 19, the control circuit board 17 is pushed in position by the spacer sections 23 formed on the recess portions 22.

In the present embodiment, press-fit type power supply connection terminals 24 are mounted on the power supply/conversion circuit board 16. At the time of attachment of the connector assembly 13, flat-shaped power supply connection terminals 25 embedded in the power supply terminal forming parts 13A and 13B are fitted in the respective power supply connection terminals 24.

Although not shown in the figure, the plug connector as the constituent part of the "board-to-board connector" is inserted and fitted into the receptacle connector as the constituent part of the "board-to-board connector" at the time of attachment of the control circuit board 17. As a consequence, the circuit components of the control circuit board 17 and the power supply/conversion circuit board 16 are electrically connected by the board-to-board connector. The "board-to-board connector" will be described later in detail. It is herein noted that the receptacle connector is also called a socket connector.

Finally, an open end of the cap cover 12 (see FIG. 2) is fitted to the end wall 15 of the motor housing 12 so as to install therein and hermetically seal the power supply/conversion circuit board 16, the control circuit board 17 and a part of the connector assembly 13 (that is, board fixing surface part 21) although not shown in the figure. This hermetically sealing function is achieved by filling a seal groove 21S formed in the board fixing surface part 21 with a liquid seal material and then fitting an inner edge portion of the cap cover 12 into the seal groove 21S.

In the present embodiment, the cap cover 12 is fixed to the end wall 15 of the motor housing 11 by welding, bonding or swaging etc. The cap cover 12 is made of metal and thus also serves as a radiator for radiating heat generated by the power conversion and supply circuit sections etc. to the outside. As a matter of course, the cap cover 12 may alternatively be made of a synthetic resin etc.

Next will be described a state in which the power supply/conversion circuit board 16 is attached to the motor housing 11. FIG. 4 shows the power supply/conversion circuit board 16 attached to the end wall 15 of the motor housing 11. FIG. 5 shows the power supply/conversion circuit board 16 as seen from the top side.

Figure 4:
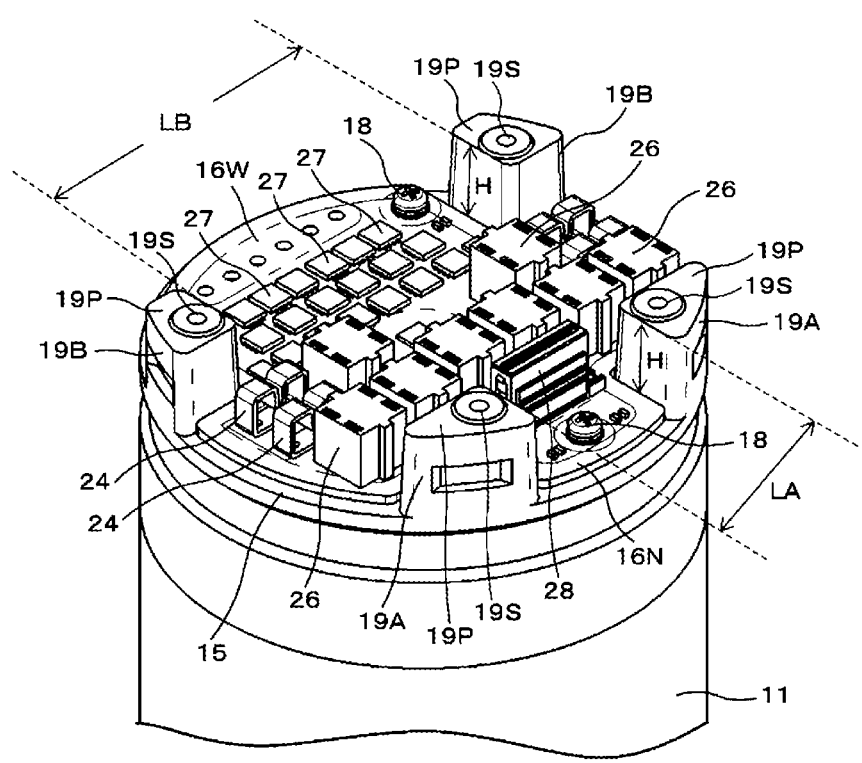
FIG. 4 is a perspective view of the electronic control unit, as seen from diagonally above, in a state that a control circuit board has been removed from the electric power steering device of FIG. 3.
Figure 5:
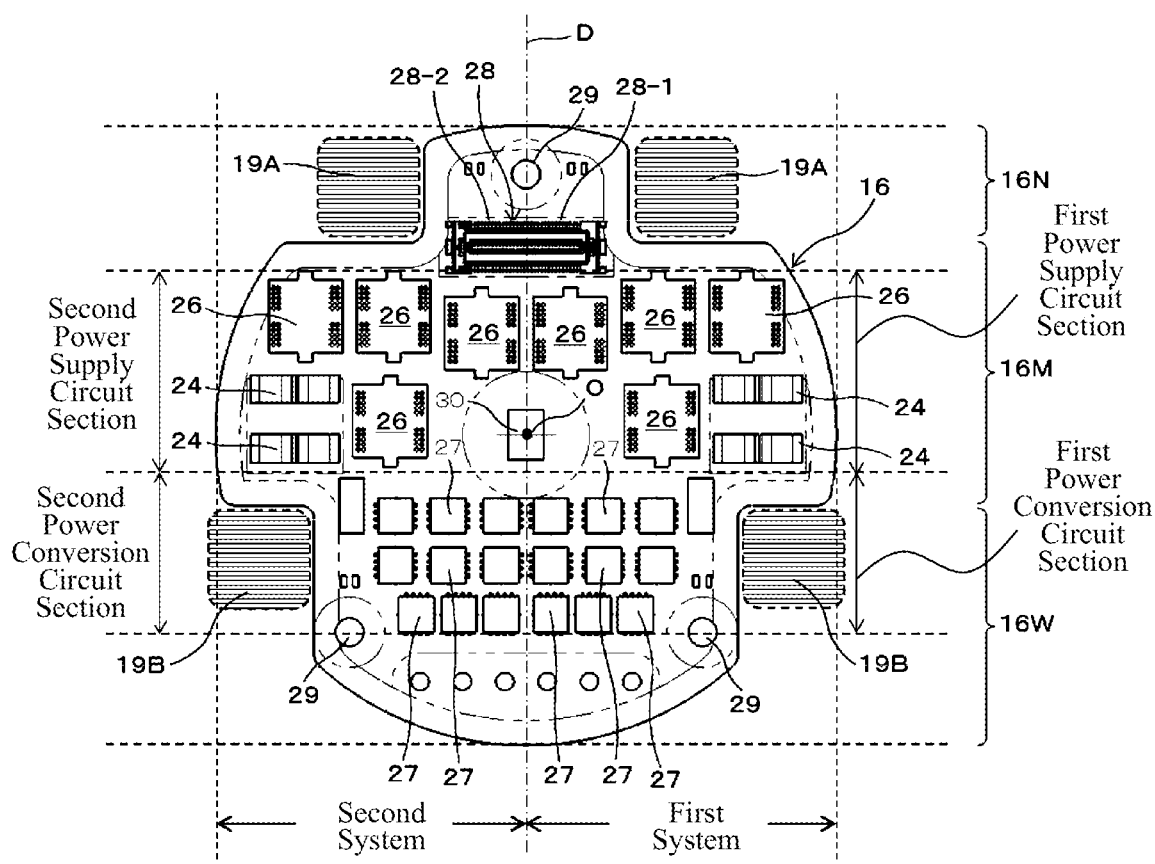
FIG. 5 is a top view of a power supply/conversion circuit board of the electronic control unit.

As shown in FIG. 4, the power supply/conversion circuit board 15 is integrally fixed to the end wall 15 of the motor housing 11 by the fixing bolts 18. Further, the board fixing supporting parts 19 are formed at four locations on the outer peripheral portion of the end wall 15 of the motor housing 11, including a pair of board fixing supporting parts (narrow spaced parts) 19A and a pair of board fixing supporting parts (wide spaced parts) 19B. A distance (LA) between the pair of board fixing supporting parts 19A is set shorter than a distance (LB) between the pair of board fixing supporting parts 19B.

In other words, a line segment connecting the centers of the bolt holes 19S of the board fixing supporting parts (narrow spaced parts) 19A is located at a position apart from the axis of the motor housing 11; and a line segment connecting the centers of the bolt holes 19S of the board fixing supporting parts (wide spaced parts) 19B is located at a position closer to the axis of the motor housing 11. The line segment connecting the board fixing supporting parts (narrow spaced parts) 19A and the line segment connecting the board fixing supporting parts (wide spaced parts) 19B are in a parallel positional relationship.

Furthermore, the board fixing supporting parts (narrow spaced parts) 19A and the board fixing supporting parts (wide spaced parts) 19B are in an axisymmetric relationship with respect to a dividing line D (see FIG. 5) connecting a midpoint of the line segment between the bolt holes 19S of the board fixing supporting parts (narrow spaced parts) 19A and a midpoint of the line segment between the bolt holes 19S of the board fixing supporting parts (wide spaced parts) 19B.

Board placement portions 19P are provided on respective end faces of the board fixing supporting parts (narrow spaced parts) 19A and the board fixing supporting parts (wide spaced parts) 19B. The bolt holes 19S into which the fixing bolts 20 are screwed are formed in sections of the board placement portions 19P, respectively. The board surface of the control circuit board 17 is placed on these board placement portions 19P.

The board surface of the power supply/conversion circuit board 16 has an outer shape according to the arrangement relationship of the board fixing supporting parts (narrow spaced parts) 19A and the board fixing supporting parts (wide spaced parts) 19B. Thus, the board fixing supporting parts (narrow spaced parts) 19A and the board fixing supporting parts (wide spaced parts) 19B allows positioning of the power supply/conversion circuit board 16.

More specifically, the power supply/conversion circuit board 16 includes a narrow width region 16N defined between the board fixing supporting parts (narrow spaced parts) 19A and a wide width region 16W between the board fixing supporting parts (wide spaced parts). The narrow width region 16N and the wide width region 16W are located on opposite sides to each other. In the present embodiment, the narrow width region 16N and the wide width region 16W are located with an interval of 180°.

The narrow width region 16N is fixed to the end wall 15 of the motor housing 11 by one fixing bolt 18, whereas the wide width region 16W is fixed to the end wall 15 of the motor housing 11 by two fixing bolts 18. The fixing position of the bolt 18 to the narrow width region 16N is in the vicinity of an outer peripheral edge of the narrow width region 16N. The fixing positions of the fixing bolts 18 to the wide width region 16W are on both end sides of the wide width region 16W, that is, close to the respective board fixing supporting parts (wide spaced parts) 19B.

The circuit components forming the power supply and conversion circuit sections are mounted on a board surface of the power supply/conversion circuit board 16 opposite to and facing away from the end wall 15. The power supply circuit section includes a capacitor and a coil as main circuit components 26 (hereinafter referred to as power supply circuit components). These power supply circuit components 26 are arranged at positions closer to the narrow width region 16N. The power conversion circuit section includes switching elements as main circuit components 27 (hereinafter referred to as power conversion circuit components). These power conversion circuit components 27 are arranged at positions closer to the wide width region 16W. It is needless to say that the circuit components are not limited to those mentioned above.

The receptacle connector 28 as the constituent part of the "board-to-board connector" is arranged on the narrow width region 16N side at a location between the fixing bolt 18 and the power supply circuit components 26. This receptacle connector 28 is disposed to extend in the direction perpendicular to the board surface on which the power supply circuit components 26 and the power conversion circuit components 27, that is, in the axis direction away from the end wall 15 of the motor housing, and hence is connected with the after-mentioned plug connector in the axis direction.

As mentioned above, the height (H) of the board fixing supporting parts (narrow spaced parts) 19A and the board fixing supporting parts (wide spaced parts) 19B from the end wall 15 is set to the height required for installation of the power supply circuit components 26, the power conversion circuit components 27 and the "board-to-board connector". By this height setting, the power supply and conversion circuit components and the board-to-board connector are prevented from interfering with the control circuit board 17.

The arrangement of the power supply circuit components 26, the power conversion circuit components 27 and the receptacle connector 28 on the power supply/conversion circuit board 16 will be now described below. Since the redundant circuit configuration is adopted as mentioned above in the present embodiment, the first and second systems of the circuit board have the same circuit structure.

As shown in FIG. 5, the planar shape of the board surface of the power supply/circuit board 16 is defined by the narrow width region 16N formed between the pair of board fixing supporting parts (narrow spaced parts) 19A as indicated by a broken line, the wide width region 16W formed between the pair of board fixing supporting parts (wide spaced parts) 19B as indicated by a broken line and a maximum width region 16M formed between the narrow width region 16N and the wide width region 16W. In other words, the narrow width region 16N, the maximum width region 16M and the wide width region 16W are provided in this order from the pair of board fixing supporting parts (narrow spaced parts) 19A toward the pair of board fixing supporting parts (wide spaced parts) 19B.

With respect to the dividing line D connecting the midpoint of the shortest line segment between sides of the narrow width region 16N opposed to the board fixing supporting parts (narrow spaced parts) 19A and the midpoint of the shortest line segment between sides of the wide width region 16W opposed to the board fixing supporting parts (wide spaced parts) 19B, the power supply and conversion circuit sections of the first system are disposed on the right side in FIG. 5; and the power supply and conversion circuit sections of the second system are disposed on the left side in FIG. 5.

A bolt insertion hole 29 in which the fixing bolt 18 is inserted is formed in the narrow width region at a position corresponding to the midpoint of the line segment between the sides of the narrow width region 16N opposed to the board fixing supporting parts (narrow spaced parts) 19A. The receptacle connector 28 as the constituent part of the "board-to-board connector" is fixed in position between the bolt insertion hole 29 and the power supply circuit section disposed on the maximum width region 16M.

Figure 12:
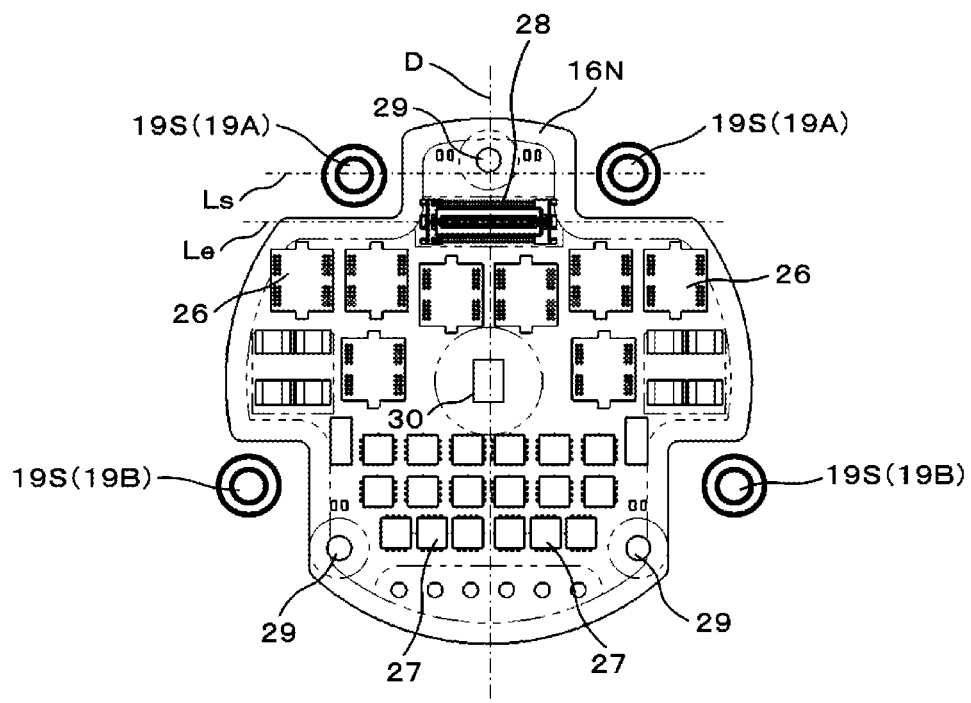
FIG. 12 is a schematic view showing the positional relationship between the board fixing supporting parts, the power supply/conversion circuit board and the receptacle connector.

The receptacle connector 28 is formed in an elongated shape with a plurality of electrodes aligned thereon, and is mounted to the power supply/conversion circuit board 16 such that an longitudinal direction of the receptacle connector 28 is in parallel with the line segment between the bolt holes 19S of the board fixing supporting parts (narrow spaced parts) 19A as shown in the after-mentioned FIG. 12. This receptacle connector 28 is in an equally divided arrangement with respect to the dividing line D.

Although the receptacle connector 28 is basically located in the narrow width region 16N, the receptacle connector 28 can be located across the narrow width region 16N and the maximum width region 16M as in the present embodiment.

In the present embodiment, the power supply circuit section and the power conversion circuit section are each provided in a redundant configuration. The receptacle connector 28 thus has, on both sides thereof with respect to the dividing line D, a receptacle connector part 28-1 for the first system and a receptacle connector part 28-2 for the second system. The receptacle connector part 28-1 for the first system and the receptacle connector part 28-2 for the second system are axisymmetric with respect to the dividing line D.

The power supply circuit section of the first system and the power supply circuit section of the second system are arranged, symmetrically with respect to the dividing line D, on the maximum width region 16M. The reason for the arrangement of the power supply circuit section on the maximum width region 16M is because the circuit components such as capacitor and coil forming the power supply circuit are large in size.

The power conversion circuit section of the first system and the power conversion circuit section of the second system are arranged, symmetrically with respect to the dividing line D, on the wide width region 16W. Two bolt insertion holes 29 in which the fixing bolts 18 are inserted are formed in the wide width region at positions outside the power conversion circuit sections of the first and second systems and adjacently opposed to the board fixing supporting parts (wide spaced parts) 19B.

A rotational position detection sensor 30 is disposed in the vicinity of the center of the power supply/conversion circuit board 16 and, more specifically, at a midpoint O (indicated by ●) of a segment of the dividing line D extending between outer peripheral edges of the narrow width region 16N and the wide width region 16W. This midpoint O is situated on an extension of the rotation axis of the rotation shaft 14.

The rotational position detection sensor 30 is used to detect a rotational position of the rotation shaft 24 of the electric motor for control of the electric motor and is provided with a GMR element etc. A magnet element is fixed to an end portion of the rotation shaft 14 opposite to the output part 14A. The rotational state of the rotation shaft 14 is detected by the magnet element and the GMR element.

As described above, the power supply/conversion circuit board 16 shown in FIG. 5 is placed on the end wall 15 of the motor housing 11 and fixed in position by the fixing bolts 18. The fixed state of the power supply/conversion circuit board 16 is as shown in FIG. 4. The control circuit board 17 is attached after the attachment of the power supply/conversion circuit board 17.

Figure 6:
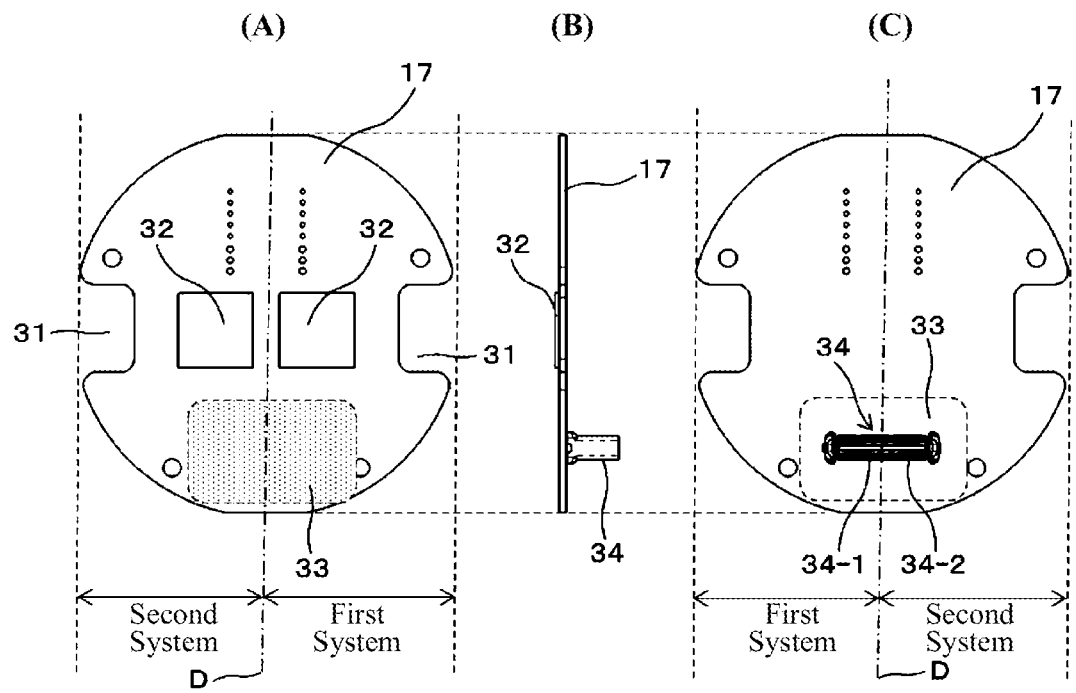
FIG. 6 is a configuration view of the control circuit board, where (A) is a top view of the control circuit board; (B) is a side view of the control circuit board; and (C) is a back view of the control circuit board.

FIG. 6 shows the configuration of the control circuit board 17 where (A) is a top view of the board surface (mounting surface) on which the circuit components of the control circuit section are mounted; (B) is a side view of the control circuit board 17 as seen from the lateral side; and (C) is a back view of the board surface (non-mounting surface) of the control circuit board opposite to the board surface on which the circuit components of the control circuit section are mounted.

The control circuit board 17 has a substantially circular shape, with cuts 31 formed therein at 180° opposed locations. These cuts 31 allow passage of the flat-shaped power supply connection terminals 25 which extend in the connector assembly 13 (see FIG. 3). With respect to the dividing line D, which passes through the center of the control circuit board 17 between the cuts 31, the control circuit section of the first system is disposed on the right side in FIG. 6(A); and the control circuit section of the second system is disposed on the left side in FIG. 6(A).

The control circuit components 32 such as electrical components and electronic components as constituent parts (i.e. microcomputers and peripheral circuit blocks) of the control circuit sections of the first and second systems are mounted, symmetrically with respect to the dividing line, on the board surface used as the mounting surface of the control circuit board 17. Although the microcomputers are illustrated in the figure, it is needless to say that the peripheral circuit blocks other than the microcomputers are mounted on the mounting board surface of the control circuit board.

A non-mounting region 33 on which the control circuit components 32 are not mounted is provided on a portion of the board surface on which the control circuit components 32 are mounted. In the illustrated embodiment, the non-mounting region 33 is provided outside of the control circuit components 32 in the direction of the dividing line D which passes through the midpoint of the line segment between opposed sides of the respective cuts 31. The effects of the non-mounting region 33 will be described later.

The plug connector 34 as the constituent part of the "board-to-board connector" is arranged on the board surface of the control circuit board 17 opposite to (in the back of) the mounting surface at a position corresponding to the non-mounting region 33. The plug connector 34 is disposed to extend in the direction perpendicular to the board surface of the control circuit board 17, that is, in the axis direction of the rotation shaft of the electric motor such that the plug connector 34 is fitted in the receptacle connector 28.

Hence, the plug connector 34 is formed in an elongated shape with a plurality of electrodes aligned thereon, and is mounted to the control circuit board 17 such that, in a state that the control circuit board 17 is placed on the board fixing supporting parts 19, a longitudinal direction of the plug connector 34 is in parallel with the line segment between the bolt holes 19S of the board fixing supporting parts (narrow spaced parts) 19A. This plug connector 34 is also in an equally divided arrangement with respect to the dividing line D.

As mentioned above, the plug connector 34 is placed in position so as to be connected with the receptacle connector 28 on the power supply/conversion circuit board 16. In other words, the plug connector 34 and the receptacle connector 28 are in such a positional relationship that, at the time of placement of the control circuit board 17 on the board fixing supporting parts (narrow spaced parts) 19A and the board fixing supporting parts (wide spaced parts) 19B, the plug connector 34 is insertable in and electrically connectable with the receptacle connector 28.

Since the control circuit section is provided in a redundant system in the present embodiment, the plug connector 34 has, on both sides of the dividing line D, a plug connector part 34-1 for the first system and a plug connector part 34-2 for the second system. The plug connector part 34-1 for the first system and the plug connector part 34-2 for the second system are axisymmetric with respect to the dividing line D.

Figure 7:
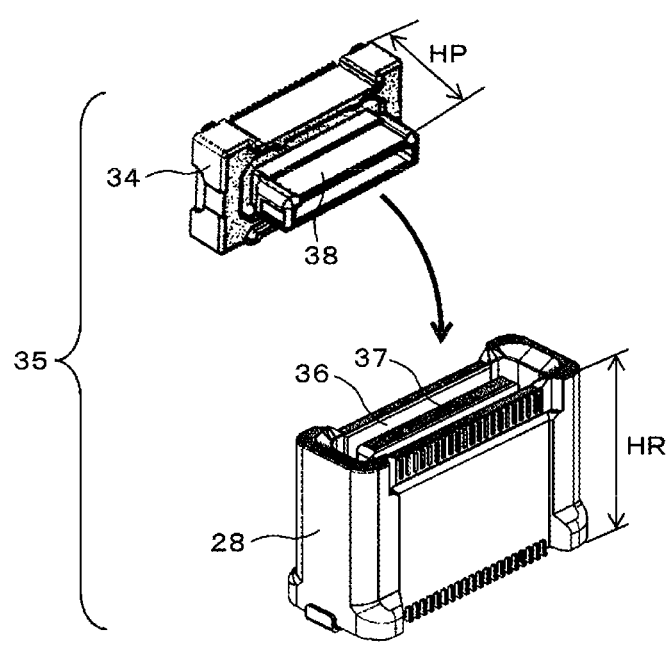
FIG. 7 is a perspective view of a "board-to-board connector" formed by a plug connector and a receptacle connector according to one embodiment of the present invention.

FIG. 7 shows one example of the "board-to-board connector" used in the present embodiment. As shown in FIG. 7, the "board-to-board connector" 35 is formed by the plug connector 34 and the receptacle connector 28. A height (HR) of the receptacle connector 28 is set higher than a height (HP) of the plug connector 34.

The receptacle connector 28 has an opening part 36 formed in a side thereof opposite the side attached to the power supply/conversion circuit board 16. A guide holding part 37, which is shorter than a width of the opening part 36, is formed in the opening part 36. The plurality of electrodes are aligned on a longitudinal portion of the opening part 36 facing the guide holding part 37. These electrodes are connected to the power supply and conversion circuit components 26 and 27 of the power supply/conversion circuit board 16.

The plug connector 34 has a protruding part 38 formed on a side thereof opposite the side attached to the control circuit board 17 such that the protruding part 38 is insertable in the opening part 36 of the receptacle connector 28. The plurality of electrodes are aligned on the protruding part 38 so as to be brought into contact with the electrodes of the opening part 36 of the receptacle connector 28. These electrodes are connected to the control circuit components of the control circuit board 17.

In the step of attaching the control circuit board 17, the protruding part 28 of the plug connector 34 is inserted in the opening part 36 of the receptacle connector 28, whereby the electrodes of the respective connectors are electrically connected to each other. Since the plug connector 34 is inserted into the receptacle connector 28 in the axis direction of the rotation shaft 14 of the electric motor, it is possible to, even when there occurs an assembling error of the control circuit board 17 in the axis direction, absorb such an assembling error. The "board-to-board connector" may alternatively be configured as a floating connector having a floating mechanism capable of absorbing errors in vertical and horizontal directions.

With the use of the above-configured "board-to-board connector" 35, the following effects are obtained: electrical connection can be made with a narrow pitch so as to allow product miniaturization; the board attaching step (board connection step) becomes simplified and can be carried out in a short time; and improvement in vibration resistance can be expected.

Figure 8:
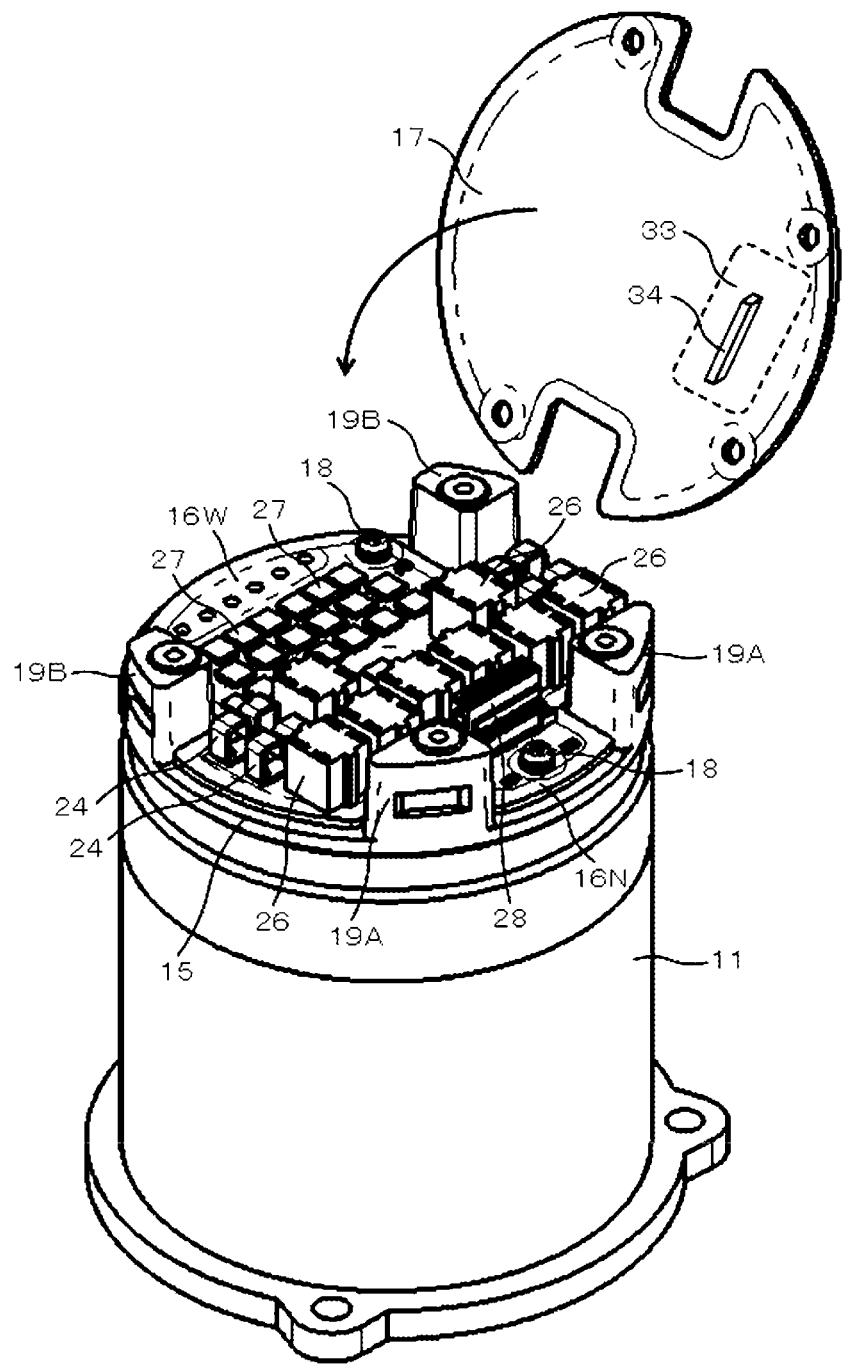
FIG. 8 is a perspective view of the electronic control unit, as seen from diagonally above, at the time of installation of the control circuit board in the electric power steering device of FIG. 4.

As shown in FIG. 8, the control circuit board 17 is placed on the board fixing supporting parts (narrow spaced parts) 19A and the board fixing supporting parts (wide spaced parts) 19B from above the previously attached power supply/conversion circuit board 16. Then, the board fixing surface part 21 of the connector assembly 13 is placed from above the control circuit board 17 as shown in FIG. 3.

The fixing bolts 20 are inserted through the bolt insertion holes of the recess portions 22 of the board fixing surface part 21 and screwed into the bolt holes of the board fixing supporting parts (narrow spaced parts) 19A and the board fixing supporting parts (wide spaced parts) 19B so that the control circuit board 17 is fixed in position with the board surface of the control circuit board 17 being pushed by the spacer sections 23 on the recess portions 22.

In the step of attaching the control circuit board 17 by placing the control circuit board on the board fixing supporting parts (narrow spaced parts) 19A and the board fixing supporting parts (wide spaced parts) 19B and fixing the control circuit board in position by the fixing bolts 20, the plug connector 34 on the control circuit board 17 is inserted into the receptacle connector 28. Thus, electrical connection is established between the plug connector and the receptacle connector simultaneously with the attachment of the control circuit board.

In a state that the power supply/conversion circuit board 16 and the control circuit board 17 are attached to the end wall 15 of the motor housing 11, the plug connector 34 on the control circuit board 17 and the receptacle connector on the power supply/conversion circuit board 16 form the "board-to-board connector" between the board surfaces of the respective circuit boards so as to make electrical connection between the circuit components 26 and 27 of the power supply/conversion circuit board 16 and the circuit components 32 of the control circuit board 17.

As described above, electrical connection is made by insertion of the plug connector 34 into the receptacle connector 28. This leads to improvement in connection reliability. Since electrical connection is made simultaneously with the attachment of the control circuit board 17, increase in production cost can be suppressed.

The characteristic configurations and effects of the present embodiment will be explained below with reference to the drawings.

Figure 9:
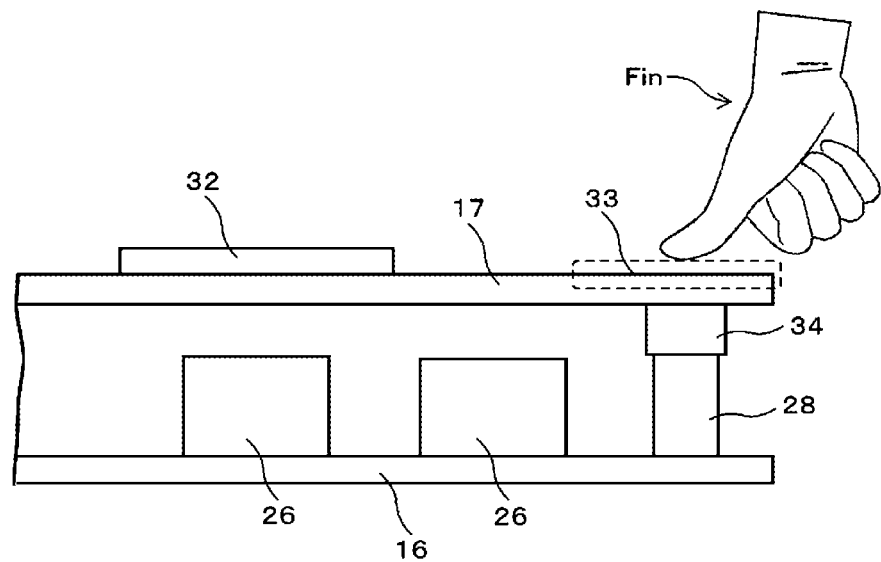
FIG. 9 is a schematic view showing a mounted state of the plug connector on the control circuit board and the receptacle connector on the power supply/conversion circuit board.

FIG. 9 is a schematic view showing mounting of the receptacle connector 28 on the power supply/conversion circuit board 16 and mounting of the plug connector 34 on the control circuit board 17.

The height (HR) of the receptacle connector 28 is set higher than the height (HP) of the plug connector 34 as mentioned above. Thus, the long-height circuit components such as electrolytic capacitor and coil and the receptacle connector 28 can be mounted on the power supply/conversion circuit board 16, whereas the short-height circuit components such as microcomputer and the plug connector can be mounted on the control circuit board 17. As the height dimensions of the circuit components and the connector on each circuit board are set closer to each other, the circuit boards are improved in handleability and packing characteristics.

The control circuit components 32 are mounted on the board surface of the control circuit board 17 opposite to the board surface facing the power supply and conversion circuit components 26 and 27 of the power supply/conversion circuit board 16. The control circuit components 32 are thus prevented from being affected by heat (in particular, radiant heat) from the power supply circuit components 26 and the power conversion circuit components 27.

Furthermore, the non-mounting region 33 is provided on the board surface of the control circuit board 17 on which the control circuit components 32 are mounted. The plug connector 34 is thus inserted into the receptacle connector 28 by pushing the non-mounting region 33 with a finger (Fin) in a state that the control circuit board 17 is placed on the board fixing supporting parts (narrow spaced parts) 19A. This enables reliable insertion of the plug connector 34 into the receptacle connector 28. It is noted that, in the figure, the finger is illustrated smaller than its actual size.

Figure 10:
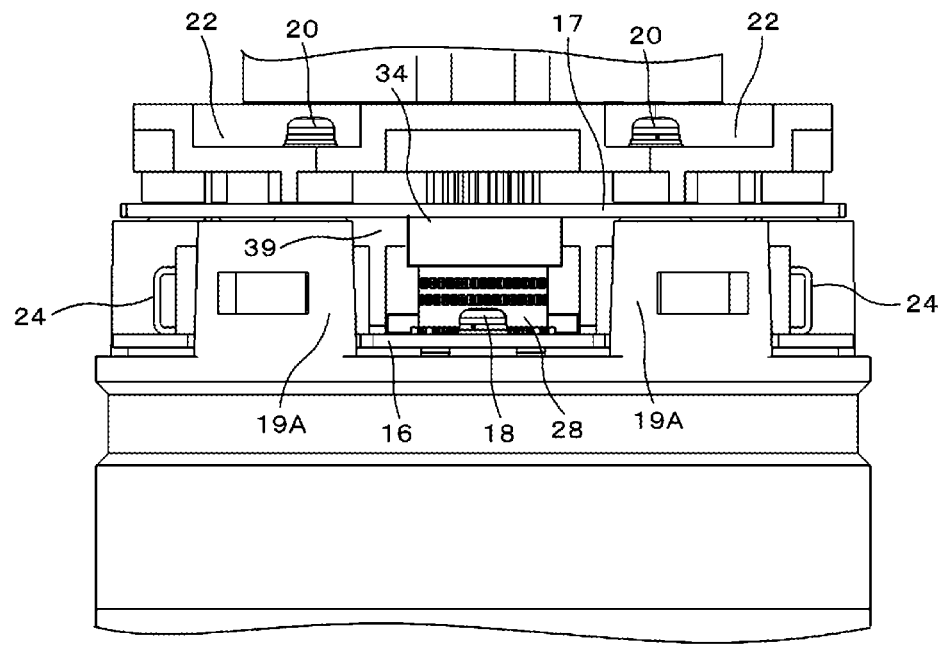
FIG. 10 is a side view of the electronic control unit in a state that the cap cover has been removed from the electronic power steering device of FIG. 3.

FIG. 10 is a schematic view showing that the connection state of the receptacle connector 28 and the plug connector 34 can be visually confirmed.

As shown in FIG. 10, the pair of board fixing supporting parts (narrow spaced parts) 19A are disposed on both sides of the narrow width region 16N, with a window section 39 being defined between these board fixing supporting parts (narrow spaced parts) 19A. The window section 39 is formed with a height equal to the height (HP) of the board fixing supporting parts (narrow spaced parts) 19A and a predetermined length extending between the board fixing supporting parts (narrow spaced parts) 19A.

As shown in FIG. 5, the narrow width region 16N is provided between the board fixing supporting parts (narrow spaced parts) 19A. As the constituent parts of the "board-to-board connector" 35, the receptacle connector 28 is arranged on the board surface of the narrow width region 16N in the axis direction of the rotation shaft 14; and the plug connector 34 is correspondingly arranged on the board surface of the control circuit board 17 in the axis direction of the rotation shaft 14. These connectors are connected with each other.

Thus, the connection state of the receptacle connector 28 and the plug connector 34 can be easily visually observed through the window section 39 defined between the board fixing supporting parts (narrow spaced parts) 19A in a state that the power supply/conversion circuit board 16 and the control circuit board 17 are attached to the end wall 15 of the motor housing 11. This allows reassembling when the connection state of the receptacle connector 28 and the plug connector 34 is judged as not proper during the assembling process.

Figure 11:
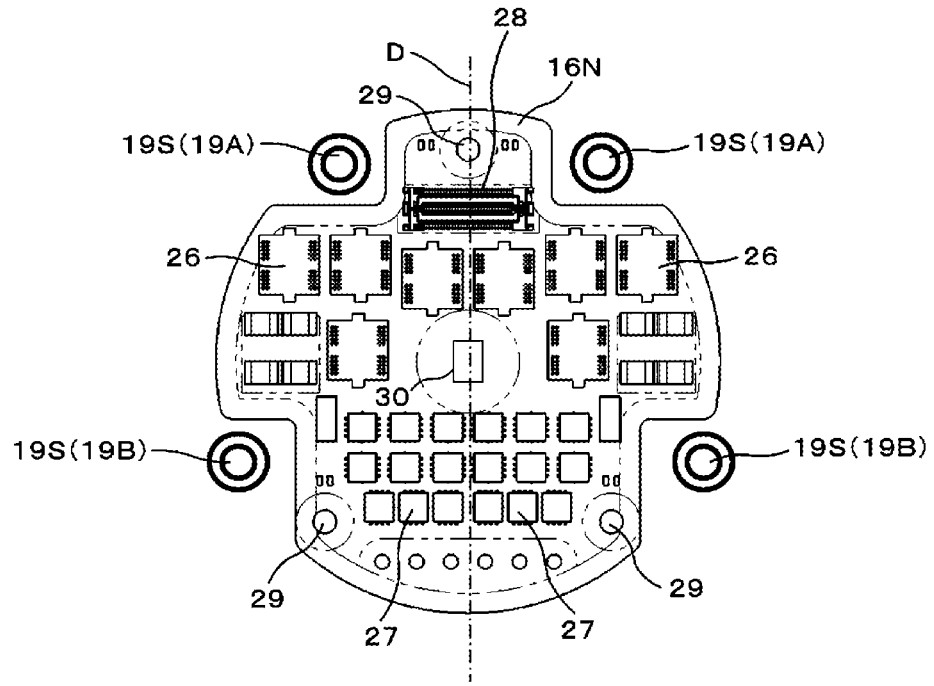
FIG. 11 is a schematic view showing the positional relationship between an attaching part of the power supply/conversion circuit board and the receptacle connector

FIG. 11 is a schematic view showing that the influence of mechanical external force such as vibration or impact on the receptacle connector 28 on the power supply/conversion circuit board 16 can be reduced.

As shown in FIG. 11, the narrow width region 16N of the power supply/conversion circuit board 16 is provided between the board fixing supporting parts (narrow spaced parts) 19A and is fixed to the end wall 15 of the motor housing 11 by the fixing bolt 18 inserted through the bolt insertion hole 29 of the narrow width region. The narrow width region 16N is hence firmly secured to the end wall 15 by this fixing bolt 18.

The receptacle connector 28 is disposed between the fixing bolt 18 and the power supply circuit components 26 on the circuit board, and thus is arranged adjacent to the fixing bolt 18. Accordingly, even when a mechanical external force such as vibration or impact is exerted on the power supply/conversion circuit board 16, such a mechanical external force is received by the fixing bolt 18 and prevented from acting on the receptacle connector 28. The receptacle connector 28 is thus improved in durability by arranging the fixing bolt 18 adjacent to the receptacle connector 28 as mentioned above.

FIG. 12 is a schematic view showing reliable plug-in connection between the receptacle connector 28 and the plug connector 34.

As shown in FIG. 12, the narrow width region 16N of the power supply/conversion circuit board 16 is provided between the board fixing supporting parts (narrow spaced parts) 19A and is fixed to the end wall 15 of the motor housing 15 by the fixing bolt 18. Further, the longitudinal axial line (Le) of the receptacle connector 28 is aligned in parallel with the line segment (Ls) between the bolt holes 19S of the board fixing supporting parts (narrow spaced parts) 19A.

On the other hand, the control circuit board 17 is firmly fixed to the board placement portions 19P of the board fixing supporting parts (narrow spaced parts) 19A by the fixing bolts 20. As in the case of the receptacle connector 28, the longitudinal axial line of the plug connector 34 is aligned in parallel with the line segment (Ls) between the bolt holes 19S of the board fixing supporting parts (narrow width parts) 19A.

When the control circuit board 17 is fixed by the filing bolts 20, this fixing force acts on the plug connector 34 through the control circuit board 17 to achieve reliable plug-in connection between the receptacle connector 28 and the plug connector 34. Consequently, the connection state of the receptacle connector 28 and the plug connector 34 is prevented from deterioration even when mechanical vibrations are exerted on the connection between these connectors.

Figure 13:
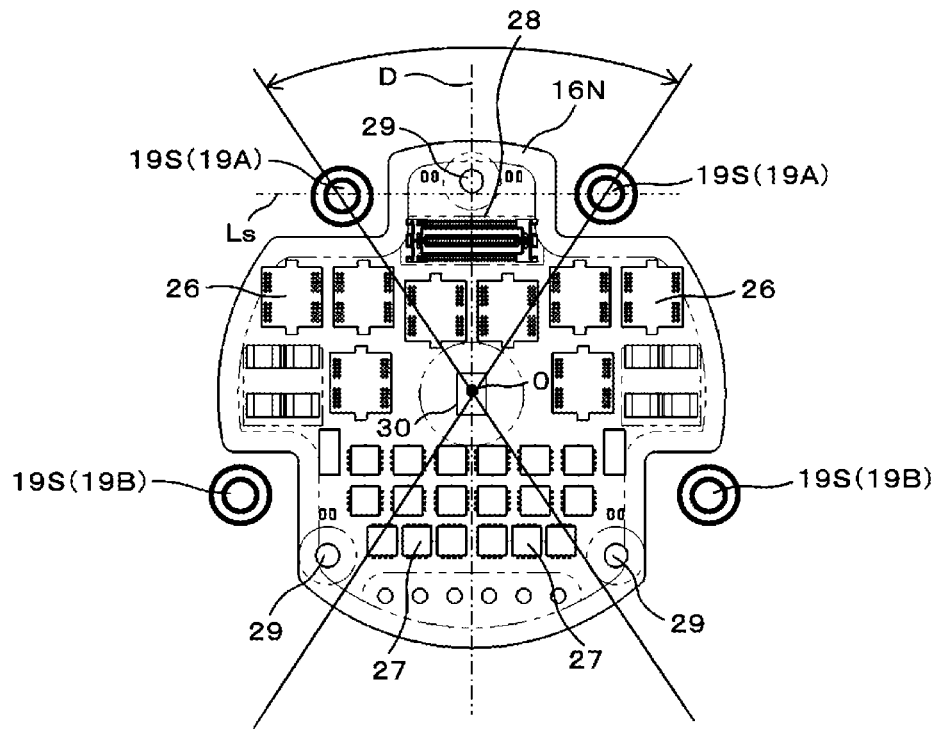
FIG. 13 is a schematic view showing the positional relationship between the board fixing supporting parts, the power supply/conversion circuit board and the receptacle connector.

FIG. 13 is a schematic view showing reliable plug-in connection between the receptacle connector 28 and the plug connector 34 with less bending in a portion of the power supply/conversion circuit board 16 in the vicinity of the plug connector 34.

As not specifically shown in FIG. 13, the control circuit board 17 is firmly fixed to the board placement portions 19P of the board fixing supporting parts (narrow spaced parts) 19A by the fixing bolts 20. As in the case of the receptacle connector 28, the longitudinal axial line of the plug connector 34 is aligned in parallel with the line segment (Ls) between the bolt holes 19S of the board fixing supporting parts (narrow spaced parts) 19A as shown in FIG. 12.

Furthermore, the receptacle connector 28 and the plug connector 34 are disposed in an area surrounded by lines linking the axis (center) point O of the rotation shaft 14 with the bolt insertion holes 19S of the board fixing supporting parts (narrow spaced parts) 19A. As a result, a portion of the control circuit board 17 between the board fixing supporting parts (narrow spaced parts) 19A is made shorter in length and less likely to bend. As the control circuit board 17 is less likely to bend in a state of being fixed to the board fixing supporting parts (narrow spaced parts) 19A by the fixing bolts 20, the plug connector 34 is reliably connected with the receptacle connector 28 only by fixing the control circuit board by the fixing bolts 20.

Figure 14:
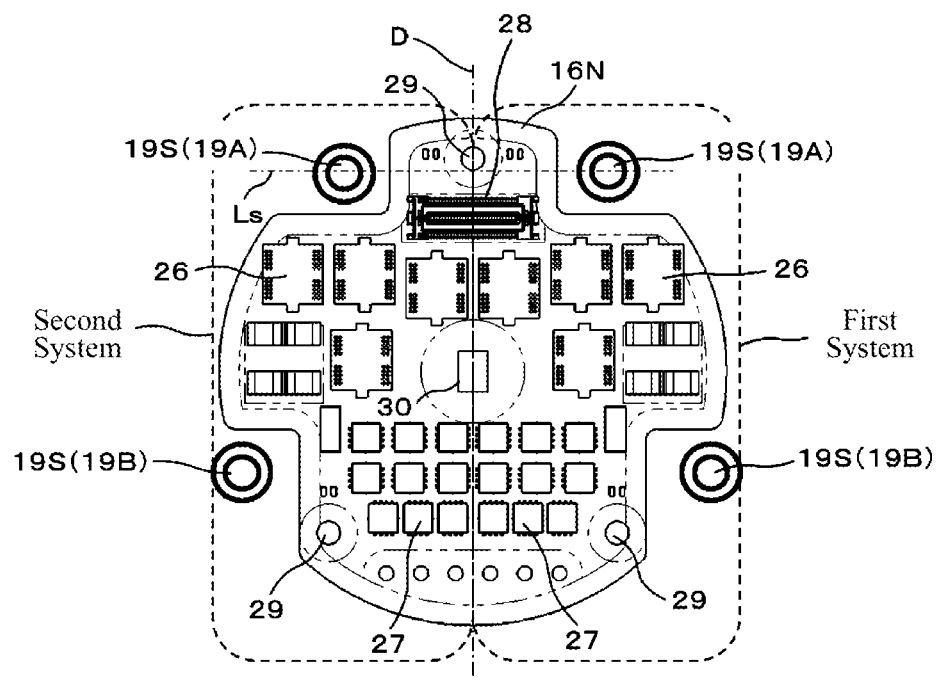
FIG. 14 is a schematic view showing the positional relationship between redundant system components of the power supply/conversion circuit board and the receptacle connector.

FIG. 14 is a schematic view showing efficient formation of printed wirings with the symmetric arrangement of the power supply circuit components 26, the power conversion circuit components 27 and the receptacle connector 28 with respect to the dividing line D.

In FIG. 14, the power supply and conversion circuit components 26 and 27 of the first system are mounted on the right side of the mounting surface of the power supply/conversion circuit board 16 with respect to the dividing line D; and the power supply and conversion circuit components 26 and 27 of the second system are mounted on the left side of the mounting surface of the power supply/conversion circuit board 16 with respect to the dividing line D. Further, the receptacle connector 28 is arranged centering on the dividing line D such that the longitudinal direction of the receptacle connector is aligned in parallel with the line segment between the bolt holes 19S of the board fixing supporting parts (narrow spaced parts) 19A.

Then, the power supply and conversion circuit components 26 and 27 and the receptacle connector 28 are disposed symmetrically with respect to with respect to the dividing line D. This arrangement allows efficient formation of printed wirings for connection of the circuit components to the electrodes of the receptacle connector 28, which leads to product miniaturization.

As a matter of course, the control circuit components 32 on the control circuit board 17 and the plug connector 34 are similarly provided for the first and second systems as shown in FIG. 6. These circuit components and the plug connector are disposed symmetrically with respect to the dividing line D. This arrangement also allows efficient formation of printed wirings for connection of the control circuit components 32 to the electrodes of the plug connector 34, which leads to product miniaturization.

In the present embodiment, the "board-to-board connector" 35 is provided as an integrated unit for the first and second systems. Alternatively, a "board-to-board connector" for the first system and a "board-to-board connector" for the second system may be provided as separate members. In this case, two "board-to-board connectors" are arranged symmetrically with respect to the dividing line D.

Although two circuit boards: the power supply/conversion circuit board and the control circuit board are provided in the present embodiment, it is alternatively feasible to provide three circuit boards: a power supply circuit board mounting thereon the power supply circuit section, a power conversion circuit board mounting thereon the power conversion circuit section and the control circuit board. In this case, the "board-to-board connectors" are provided between the respective circuit boards.

As described above, the electric drive device according to the present invention is so configured that: the first and second circuit boards mounting thereon the circuit components for driving and controlling the electric motor are stacked with a left therebetween such that one board surface of the first circuit board and one board surface of the second circuit board are opposed to and face each other in the direction of the rotation shaft of the electric motor; and, in a state that the first and second control circuit boards are attached to the end wall of the motor housing, the plug connector mounted on the first circuit board and the receptacle connector mounted on the second circuit board form between the opposed board surfaces of the first and second circuit boards so as to make electrical connection between the circuit components of the first circuit board and the circuit components of the first circuit board.

This configuration enables making electrical connection between the circuit boards during the assembling process and brings about improvement in the reliability of connection between the circuit boards.

Although the above-mentioned embodiment specifically refers to the electric power steering device for performing steering assist, the present invention is also applicable to a so-called "steer-by-wire" steering device in which a steering mechanism is directly driven by an electric motor in accordance with rotation of a steering wheel without mechanically coupling of a steering shaft to the steering mechanism.

The present invention is not limited to the above-mentioned embodiment. Various changes and modifications of the above-mentioned embodiment are included in the scope of the present invention. The above-mentioned embodiment has been described in detail for the purpose of clearly understandably explaining the present invention. The present invention is not necessarily limited to those having all of the above-mentioned features. It is feasible to replace any of the structural features of one embodiment with those of the other embodiment or feasible to add any of the structural features of one embodiment to the other embodiment. One embodiment can be implemented by adding, deleting or replacing any of the structural features of the other embodiment.

The invention claimed is:

1. An electric drive device, comprising:
an electric motor arranged to drive a mechanical control element;
a motor housing installing therein the electric motor; and
at least two first and second circuit boards attached to an end wall of the motor housing opposite to an output portion of a rotation shaft of the electric motor and mounting thereon circuit components for driving of the electric motor,
wherein the first and second circuit boards are stacked, with a space left therebetween, such that one board surface of the first circuit board and one surface of the second circuit board are opposed to and face each other in an axis direction of the rotation shaft of the electric motor, and
wherein, in a state that the first and second circuit boards are attached to the end wall of the motor housing, a receptacle connector mounted on the first circuit board and a plug connector mounted on the second circuit board form a board-to-board connector between the one board surfaces of the first and second circuit boards so that the circuit components of the first and second circuit boards are electrically connected by the board-to-board connector.

2. The electric drive device according to claim 1,
wherein the receptacle connector mounted on the first circuit board and the plug connector mounted on the second circuit board are arranged to extend in the axis direction and are electrically connected by bringing the receptacle connector and the plug connector closer to each other in the axis direction.

3. The electric drive device according to claim 2,
wherein the first circuit board is fixed to the end wall,
wherein the receptacle connector is mounted on the first circuit board so as to extend in the axis direction of the rotation shaft away from the end wall,
wherein board fixing supporting parts are provided on the end wall so as to extend away from the end wall in the axis direction of the rotation shaft,
wherein the second circuit board is fixed to the board fixing supporting parts, and
wherein the plug connector is mounted on the second circuit board so as to extend in the axial direction of the rotation shaft toward the end wall.

4. The electric drive device according to claim 3,
wherein a length of the receptacle connector in the axis direction of the rotation shaft is longer than a length of the plug connector in the axis direction of the rotation shaft.

5. The electric drive device according to claim 3,
wherein power supply circuit components forming a power supply circuit and power conversion circuit components forming a power conversion circuit are mounted as the circuit components on the one board surface of the first circuit board opposite to and facing away from the end wall, and
wherein control circuit components forming a control circuit are mounted as the circuit components on the other board surface of the second circuit board opposite to and facing away from the first circuit board.

6. The electric drive device according to claim 5,
wherein the other board surface of the second circuit board on which the control circuit components are mounted includes a non-mounting region where the control circuit components are not mounted, and
wherein the plug connector is mounted on the one board surface of the second circuit board at a location corresponding to the non-mounting region.

7. The electric drive device according to claim 5,
wherein the board fixing supporting parts are provided at four locations on an outer peripheral portion of the end wall and consist of a pair of narrowly spaced first board fixing supporting parts and a pair of widely spaced second board fixing supporting parts arranged such that a distance between the first board fixing supporting parts is shorter than a distance between the second board fixing supporting parts,
wherein the first circuit board includes a narrow width region defined between the first board fixing supporting parts, a wide width region defined between the second board fixing supporting parts and a maximum width region defined between the narrow width region and the wide width region, and
wherein the receptacle connector is located on the narrow width region,
wherein the power conversion circuit components are located on the wide width region, and
wherein the power supply circuit components are located on the maximum width region.

8. The electric drive device according to claim 7,
wherein the receptacle connector is mounted on the narrow width region such that a longitudinal axial line of the receptacle connector is in parallel with a line segment between the first board fixing supporting parts.

9. The electric drive device according to claim 7,
wherein the narrow width region and the wide width region are located on opposite sides to each other, and
wherein, when a line connecting a midpoint of a line segment between sides of the narrow width region opposed to the first board fixing supporting parts and a midpoint of a line segment between sides of the wide width region opposed to the second board fixing supporting parts is assumed as a dividing line, the receptacle connector is disposed in an area defined by lines linking a midpoint of a segment of the dividing line between outer peripheral edges of the narrow and wide width regions with the first board fixing supporting parts.

10. The electric drive device according to claim 7,
wherein a fixing bolt is provided adjacent to an outer peripheral edge of the narrow width region to fix the first circuit board to the end wall, and
wherein the receptacle connector is disposed between the fixing bolt and the power supply circuit components.

11. The electric drive device according to claim 7,
wherein there is a window section defined between the first board fixing supporting parts so that a connection part between the receptacle connector mounted on the narrow width region of the first circuit board and the plug connector mounted on the second circuit board is visually observable through the window section.

12. The electric drive device according to claim 7,
wherein the narrow width region and the wide width region are located on opposite sides to each other,
wherein the electric drive device further comprises a rotational position detection sensor configured to detect rotation of a magnet element fixed to an end portion of the rotation shaft opposite to the output portion, and
wherein, when a line connecting a midpoint of a line segment between sides of the narrow width region opposed to the first board fixing supporting parts and a midpoint of a line segment between sides of the wide width region opposed to the second board fixing supporting parts is assumed as a dividing line, the rotational position detection sensor is arranged at a midpoint of a segment of the dividing line between outer peripheral edges of the narrow and wide width regions.

13. The electric drive device according to claim 5,
wherein the board fixing supporting parts are provided at four locations on an outer peripheral portion of the end wall and consist of a pair of narrowly spaced first board fixing supporting parts and a pair of widely spaced second board fixing supporting parts arranged such that a distance between the first board fixing supporting parts is shorter than a distance between the second board fixing supporting parts,
wherein the first circuit board includes a narrow width region defined between the first board fixing supporting parts, a wide width region defined between the second board fixing supporting parts and a maximum width region defined between the narrow width region and the wide width region,
wherein, when a line connecting a midpoint of a line segment between sides of the narrow width region opposed to the first board fixing supporting parts and a midpoint of a line segment between sides of the wide width region opposed to the second board fixing supporting parts is assumed as a dividing line, the first circuit board is provided in a redundant configuration such that first power supply and conversion circuit components forming a first system and second power supply and conversion circuit components forming a second system are arranged symmetrically with respect to the dividing line, and the receptacle connector is provided in a redundant configuration symmetrically on the dividing line, wherein the receptacle connector is located on the narrow width region, wherein the first and second power conversion circuit components are located on the wide width region, and wherein the first and second power supply circuit components are located on the maximum width region.

14. An assembling method of an electric drive device, the electric drive device comprising: an electric motor arranged to drive a mechanical control element; a motor housing installing therein the electric motor; and at least two first and second circuit boards attached to an end wall of the motor housing opposite to an output portion of a rotation shaft of the electric motor and mounting thereon circuit components for driving of the electric motor, the first and second circuit boards being stacked, with a space left therebetween, such that one board surface of the first circuit board and one board surface of the second circuit board are opposed to and face each other in an axis direction of the rotation shaft of the electric motor, the first circuit board mounting thereon a receptacle connector that extends in the axis direction of the rotation shaft away from the end wall, the second circuit board mounting thereon a plug connector that extends in the axis direction of the rotation shaft toward the end wall, the assembling method comprising:

attaching the first circuit board to the end wall; and after the attaching of the first circuit board, attaching the second circuit board to the end wall while inserting the plug connector into the receptacle connector to make electrical connection between the plug connector and the receptacle connector.

* * * * *